(12) United States Patent
Sakaniwa et al.

(10) Patent No.: US 12,108,528 B2
(45) Date of Patent: Oct. 1, 2024

(54) INSULATING CIRCUIT BOARD

(71) Applicant: MITSUBISHI MATERIALS CORPORATION, Tokyo (JP)

(72) Inventors: Yoshiaki Sakaniwa, Saitama (JP); Toyo Ohashi, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 335 days.

(21) Appl. No.: 17/439,565

(22) PCT Filed: Mar. 26, 2020

(86) PCT No.: PCT/JP2020/013645
§ 371 (c)(1),
(2) Date: Sep. 15, 2021

(87) PCT Pub. No.: WO2020/196746
PCT Pub. Date: Oct. 1, 2020

(65) Prior Publication Data
US 2022/0159829 A1 May 19, 2022

(30) Foreign Application Priority Data
Mar. 26, 2019 (JP) .................. 2019-057990

(51) Int. Cl.
*H05K 1/02* (2006.01)
*H05K 1/03* (2006.01)

(52) U.S. Cl.
CPC ........... *H05K 1/032* (2013.01); *H05K 1/0203* (2013.01)

(58) Field of Classification Search
CPC ............................ H05K 1/032; H05K 1/0203
USPC ........................................................ 174/255
See application file for complete search history.

(56) References Cited

U.S. PATENT DOCUMENTS

| | | | |
|---|---|---|---|
| 8,058,566 B2 * | 11/2011 | Hsu ........................ | H05K 3/423 174/262 |
| 8,059,424 B2 * | 11/2011 | Glever .................. | H05K 3/3494 361/767 |
| 8,476,534 B2 * | 7/2013 | Zama .................... | H05K 3/4632 174/250 |
| 8,536,459 B2 * | 9/2013 | Markovich .......... | H05K 3/4623 174/262 |

(Continued)

FOREIGN PATENT DOCUMENTS

| | | |
|---|---|---|
| CN | 1160984 A | 10/1997 |
| CN | 202957293 U | 5/2013 |

(Continued)

OTHER PUBLICATIONS

JP-H06169147-A_English translation (Year: 1994).*

(Continued)

*Primary Examiner* — Anatoly Vortman
(74) *Attorney, Agent, or Firm* — Locke Lord LLP; James E. Armstrong, IV; Nicholas J. DiCeglie, Jr.

(57) ABSTRACT

Provided is an insulating circuit board including: an insulating resin layer; and a circuit layer made of metal pieces, each of which is in a circuit pattern and provided on one surface of the insulating resin layer, wherein thickness of each of the metal pieces constituting the circuit layer is 0.5 mm or more, the insulating resin layer is made of a thermosetting resin, and a void ratio in regions between the metal pieces is 0.8% or less.

3 Claims, 6 Drawing Sheets

(56) References Cited

U.S. PATENT DOCUMENTS

| | | | |
|---|---|---|---|
| 8,541,687 B2* | 9/2013 | Markovich | H05K 3/462 |
| | | | 174/262 |
| 8,895,868 B2* | 11/2014 | Sunohara | H01L 23/147 |
| | | | 174/262 |
| 9,287,201 B2* | 3/2016 | Shiota | H01L 23/36 |
| 9,953,944 B2* | 4/2018 | Ohashi | B23K 35/0238 |
| 11,222,835 B2* | 1/2022 | Sakaniwa | H05K 1/036 |
| 2002/0125563 A1 | 9/2002 | Scheuermann | |
| 2009/0302462 A1* | 12/2009 | Hosomi | H05K 1/0366 |
| | | | 156/247 |
| 2011/0120754 A1* | 5/2011 | Kondo | H01L 23/49822 |
| | | | 174/254 |
| 2011/0318609 A1 | 12/2011 | Miura et al. | |
| 2013/0240912 A1 | 9/2013 | Shiota et al. | |
| 2015/0144385 A1 | 5/2015 | Ohashi et al. | |
| 2018/0005918 A1 | 1/2018 | Naba et al. | |
| 2018/0312683 A1 | 11/2018 | Umehara et al. | |
| 2022/0159829 A1 | 5/2022 | Sakaniwa et al. | |

FOREIGN PATENT DOCUMENTS

| | | |
|---|---|---|
| JP | H06-169147 A | 6/1994 |
| JP | 09-135057 A | 5/1997 |
| JP | H10-296767 A | 11/1998 |
| JP | H10-326949 A | 12/1998 |
| JP | H11-103165 A | 4/1999 |
| JP | 2003-124603 A | 4/2003 |
| JP | 2003-331736 A | 11/2003 |
| JP | 2004-022842 A | 1/2004 |
| JP | 2005-050877 A | 2/2005 |
| JP | 2006-240955 A | 9/2006 |
| JP | 2007-053349 A | 3/2007 |
| JP | 2009-272647 A | 11/2009 |
| JP | 2010-040900 A | 2/2010 |
| JP | 2011-067849 A | 4/2011 |
| JP | 2015-207666 A | 11/2015 |
| JP | 2016-181536 A | 10/2016 |
| JP | 2017-212362 A | 11/2017 |
| JP | 2018-101763 A | 6/2018 |
| JP | 2018-147934 A | 9/2018 |
| JP | 7287455 B2 | 6/2023 |
| TW | 451471 B | 8/2001 |
| TW | 201911982 A | 3/2019 |
| WO | 2010/144127 A2 | 12/2010 |
| WO | 2012/081434 A1 | 6/2012 |

OTHER PUBLICATIONS

JP-2016181536-A English translation (Year: 2016).*
International Search Report mailed Jun. 16, 2020, issued for PCT/JP2020/013645 and English translation thereof.
Decision of Rejection mailed Aug. 30, 2022, issued for Japanese Patent Application No. 2021-509583 and English translation thereof.
Supplementary European Search Report mailed Jan. 5, 2023, issued for European Patent Application No. 20778482.8.
Office Action mailed Jul. 12, 2023, issued for TW109110170 and English translation of the Search Report.
Office Action issued in corresponding Japanese Patent Application No. JP 2022-192201, dated Nov. 21, 2023, with English Translation.
Office Action issued in Chinese Patent Application No. 202080023136.8, mailed Jan. 23, 2024.
Notice of Allowance issued in Japanese Patent Application No. JP 2022-192201, mailed Feb. 13, 2024.

* cited by examiner

INSULATING CIRCUIT BOARD

TECHNICAL FIELD

The present invention relates to an insulating circuit board including an insulating resin layer and a circuit layer made of metal pieces provided in a circuit pattern on one surface of the insulating resin layer.

Priority is claimed on Japanese Patent Application No. 2019-057990, filed Mar. 26, 2019, the content of which is incorporated herein by reference.

BACKGROUND ART

A power module, an LED module, and a thermoelectric module have a structure in which a power semiconductor element, an LED element, and a thermoelectric element are bonded to the insulating circuit board in which a circuit layer made of a conductive material is formed on one surface of an insulating layer.

As the above-described insulating circuit board, for example, a metal-based circuit board disclosed in Patent Document 1 has been proposed.

In the metal-based circuit board disclosed in Patent Document 1, the insulating resin layer is formed on a metal board, and the circuit layer having a circuit pattern is formed on the insulating resin layer. Here, the insulating resin layer is made of an epoxy resin which is the thermosetting resin, and the circuit layer is made of a copper foil.

In the metal-based circuit board, the semiconductor element is bonded on the circuit layer, and a heat sink is provided on a surface of the metal board opposite to the insulating resin layer, and heat generated by the semiconductor element is transmitted to the heat sink side and is dissipated.

Then, in the metal-based circuit board disclosed in Patent Document 1, a circuit pattern is formed by etching the copper foil provided on the insulating resin layer.

Recently, the current applied to the semiconductor element mounted on the circuit layer tends to increase, and the amount of heat generated from the semiconductor element also increases accordingly. Therefore, in order to ensure good conductivity and thermal conductivity, it is required to thicken the circuit layer. Here, in a case where the circuit layer is thickened, when the circuit pattern is formed by etching as disclosed in Patent Document 1, there is a risk that sagging is generated on an end surface of the circuit layer, and an electric field is concentrated on the end surface of the circuit layer, so that there is a risk that insulating properties are reduced.

Therefore, Patent Document 2 proposes a technique for suppressing the occurrence of sagging when etching is performed. However, even with the method disclosed in Patent Document 2, the electric field tends to concentrate on the end surface of the circuit layer, and there is a risk that the insulating properties may deteriorate. In addition, when the circuit layer is thickened, it takes time to form the circuit pattern by etching, so that the insulating circuit board cannot be efficiently manufactured.

Further, in recent years, a distance between the circuit patterns tends to be small from the viewpoint of miniaturization and weight reduction, and in a case where the circuit patterns cannot be formed with high dimensional accuracy, there is a risk that the insulating properties between the circuit patterns become insufficient.

As a method of forming the circuit layer without performing the etching, for example, Patent Document 3 proposes a technique in which a punched metal piece having a desired shape is bonded to a ceramic board. According to the method, even when the circuit layer is thickened, the sagging is not generated on an end surface of the metal piece, and the insulating properties between the circuit patterns can be obtained. Therefore, the distance between the circuit patterns can be reduced.

CITATION LIST

Patent Documents

Patent Document 1

Japanese Unexamined Patent Application, First Publication No. 2015-207666

Patent Document 2

Japanese Unexamined Patent Application, First Publication No. 2018-101763

Patent Document 3

Japanese Unexamined Patent Application, First Publication No. H09-135057

SUMMARY OF INVENTION

Technical Problem

However, in Patent Document 3, the ceramic board is used as the insulating layer, and the metal piece is bonded to the ceramic board by pressurizing the metal piece to the ceramic board in a laminating direction.

When the insulating layer is composed of the insulating resin layer made of the thermosetting resin, the metal piece is disposed on the resin composition before curing, and the metal piece is pressurized and heated in the laminating direction, so that the resin composition is cured to constitute the insulating resin layer and the insulating resin layer and the metal piece are bonded. Here, when the circuit layer is thickened, the resin composition is sufficiently pressurized in a region where the metal piece is disposed, but in a region where the metal piece is not disposed, the pressurization of the resin composition is insufficient, and a large number of voids are generated inside the insulating resin layer, so that there is a risk that the insulating properties of the insulating resin layer cannot be obtained. Therefore, in the insulating circuit board using an insulating resin layer, it is difficult to accurately form the thickened circuit layer.

The present invention has been made in view of the above-described circumstances, and an object of the present invention is to provide an insulating circuit board having a high withstand voltage, and the insulating circuit board includes a relatively thick circuit layer, and a shape of an end portion of the circuit layer is formed with high accuracy of dimensions in the insulating circuit board.

Solution to Problem

In order to solve the above problems, an insulating circuit board of the present invention includes an insulating resin layer; and a circuit layer made of metal pieces, each of which is in a circuit pattern and provided on one surface of the insulating resin layer, wherein thickness t of each of the metal pieces constituting the circuit layer is 0.5 mm or more, the insulating resin layer is made of a thermosetting resin, and a void ratio in regions between the metal pieces is 0.8% or less, and an angle θ between an end portion of each of the metal pieces and a surface of the insulating resin layer is within a range of 700 or more and 1100 or less.

According to the insulating circuit board having the above-described configuration, since the thickness t of each of the metal pieces constituting the circuit layer is 0.5 mm or more, the conductivity is obtained and the heat can be spread in a surface direction in the circuit layer, so that thermal dissipation characteristics are excellent.

In addition, since each of the metal pieces is provided in a circuit pattern, and the angle θ between the end portion of each of the metal pieces and the surface of the insulating resin layer is within the range of 700 or more and 1100 or less, the shape of the end portion of the circuit layer is formed with high accuracy, so that electric field concentration at an end portion of a bonding interface of the circuit layer can be suppressed, and the withstand voltage can be improved.

Since the insulating resin layer is made of the thermosetting resin and the void ratio of a region between the metal pieces in a circuit pattern is 0.8% or less, the insulating properties in the insulating resin layer can be obtained.

In the insulating circuit board of the present invention, it is preferable that a ratio I/t is 1.0 or less, t being the thickness of each of the metal pieces in a circuit pattern and L being a closest distance between the metal pieces.

In this case, since the ratio L/t of the thickness t of each of the metal pieces to the closest distance L between the metal pieces is 1.0 or less, it is possible to reduce the size and weight of components using the insulating circuit board.

Further, in the insulating circuit board of the present invention, it is preferable that a thermal dissipation layer is formed on a surface of the insulating resin layer opposite to the circuit layer.

In this case, the thermal dissipation layer formed on the surface of the insulating resin layer opposite to the circuit layer can efficiently dissipate heat on the circuit layer side.

A method for manufacturing the insulating circuit board according to the present invention includes a metal piece forming step of forming a metal piece to be a circuit layer; a resin composition providing step of providing a resin composition to be a thermal dissipation layer on one surface of a metal plate; a metal piece disposing step of disposing a plurality of the metal pieces in a circuit pattern on one surface of the resin composition; and a pressurizing and heating step of pressurizing and heating the metal plate, the resin composition, and the metal pieces in a laminating direction, wherein in the pressurizing and heating step, the thermal dissipation layer and the circuit layer are formed by forming an insulation layer by curing the resin composition, by bonding the metal plate and the insulating layer and by bonding the insulating layer and the metal pieces.

Since the configuration has the resin composition arranging step, the metal piece disposing step, and the pressurizing and heating step, the formation of the insulating resin layer and the bonding of the metal piece, the insulating resin layer, and the metal plate can be performed simultaneously, so that the insulating circuit board can be manufactured efficiently.

In addition, the circuit pattern can be formed without performing the etching, the shape of the end portion of the circuit layer can be formed with high accuracy, and the electric field concentration at the end portion of the bonding interface of the circuit layer can be suppressed.

In the present embodiment, since the pressurizing and heating step has a configuration that the rubber-like elastic body is disposed on the metal piece side and is pressurized, the entire resin composition can be sufficiently pressed, and voids in the insulating resin layer can be sufficiently reduced. Thereby, the insulating properties of the insulating resin layer can be obtained.

Advantageous Effects of Invention

According to the present invention, it is possible to provide an insulating circuit board having a relatively thick circuit layer, a shape of an end portion of the circuit layer, which is formed with high accuracy, and an excellent withstand voltage.

DESCRIPTION OF EMBODIMENTS

Hereinafter, embodiments of the present invention will be described with reference to the accompanying drawings.

Figure 1:
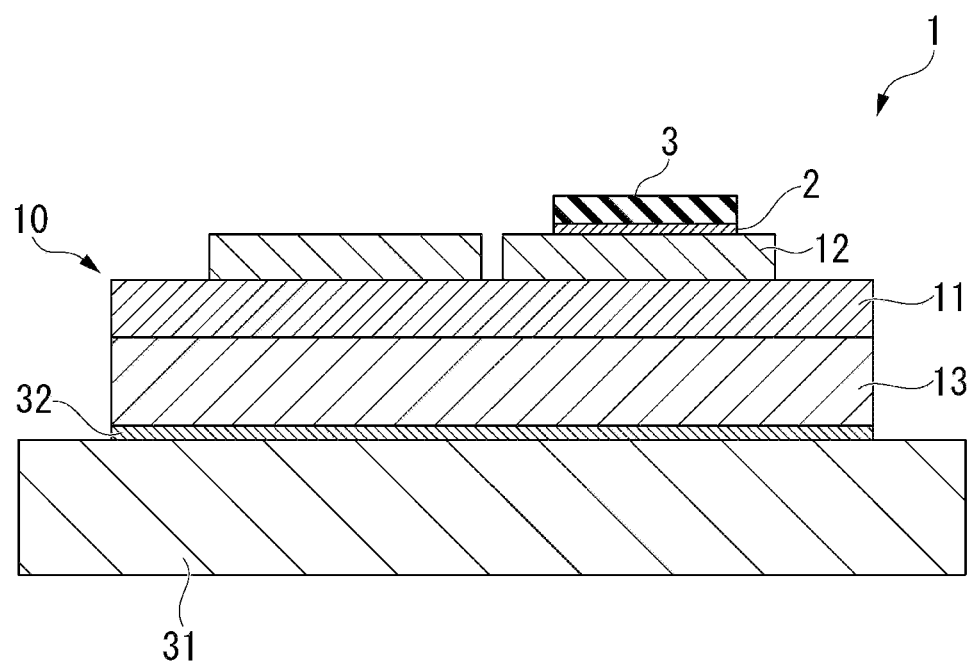
FIG. 1 is a cross-sectional explanatory view of a power module using an insulating circuit board according to an embodiment of the present invention.

FIG. 1 shows an insulating circuit board 10 according to an embodiment of the present invention and a power module 1 using the insulating circuit board 10.

The power module 1 includes the insulating circuit board 10, a semiconductor element 3 bonded to one side (upper side in FIG. 1) of the insulating circuit board 10 via a solder layer 2, and a heat sink 31 bonded to the other side (lower side in FIG. 1) of the insulating circuit board 10 via a solder layer 32.

The solder layers 2 and 32 are, for example, Sn—Ag-based, Sn—Cu-based, Sn—In-based, or Sn—Ag—Cu-based solder materials (so-called lead-free solder materials).

The semiconductor element 3 is an electronic component including a semiconductor, and various semiconductor elements are selected according to a required function.

Figure 2:
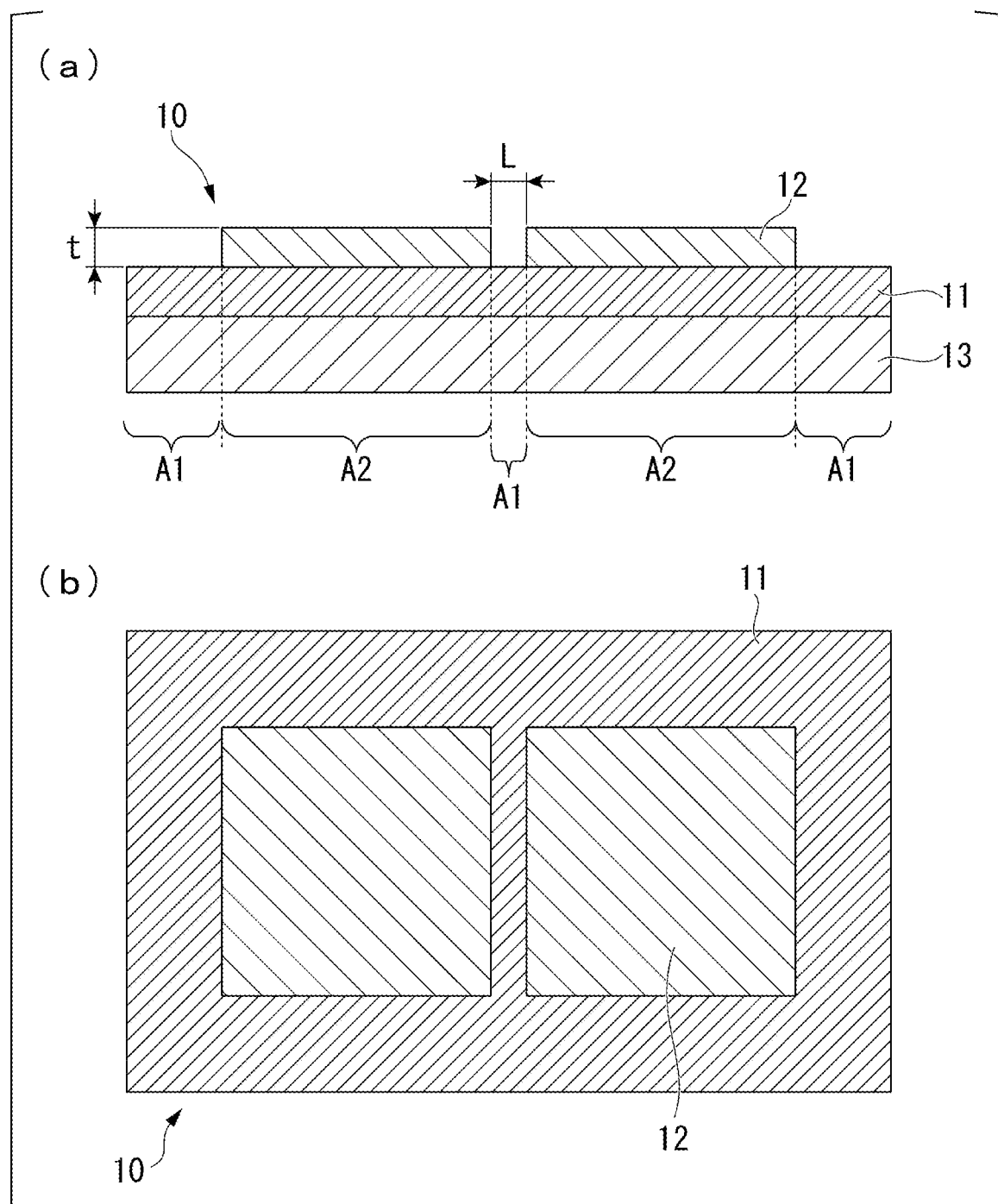
FIG. 2 is an explanatory view of an insulating circuit board according to an embodiment of the present invention. (a) is a cross-sectional view, and (b) is a top view.

As shown in FIGS. 1 and 2(a), the insulating circuit board 10 includes an insulating resin layer 11, a circuit layer 12 formed on one surface (upper surface in FIGS. 1 and 2(a)) of the insulating resin layer 11, and a thermal dissipation layer 13 formed on one surface (upper surface in FIGS. 1 and 2 (a)) of the insulating resin layer 11.

The insulating resin layer 11 prevents electrical connection between the circuit layer 12 and the thermal dissipation layer 13, and is made of a thermosetting resin having insulating properties. In the present embodiment, a thermosetting resin containing a filler is used in order to achieve the strength of the insulating resin layer 11.

Here, as the filler, for example, an alumina, a boron nitride, an aluminum nitride, and the like can be used. In addition, as the thermosetting resin, an epoxy resin, a polyimide, or the like can be used.

In the present embodiment, the insulating resin layer 11 is made of an epoxy resin containing alumina as a filler. Further, the thickness of the insulating resin layer 11 is within the range of 20 μm or more and 250 μm or less.

In the insulating resin layer 11, a void ratio B1 of a region A1 (that is, a region where the metal piece 22 is not disposed) between metal pieces (metal layer and metal member) 22 provided in a circuit pattern is 0.8% or less. The void ratio B1 of the region A1 between the metal pieces 22 provided in the circuit pattern is preferably 0.7% or less, and more preferably 0.6% or less.

In addition, in the present embodiment, a ratio B2/B1 of the void ratio B2 of the region A2 where the metal piece 22 is disposed and the void ratio B1 of the region A1 between the metal pieces 22 provided in the circuit pattern is within a range of 0.5 or more and 1.5 or less, a difference between the void ratio B1 of the region A1 between the metal pieces 22 provided in the circuit pattern and the void ratio B2 of the region A2 where the metal piece 22 is disposed is small, and the void ratio is relatively uniform in the entire insulating resin layer 11.

Figure 6:
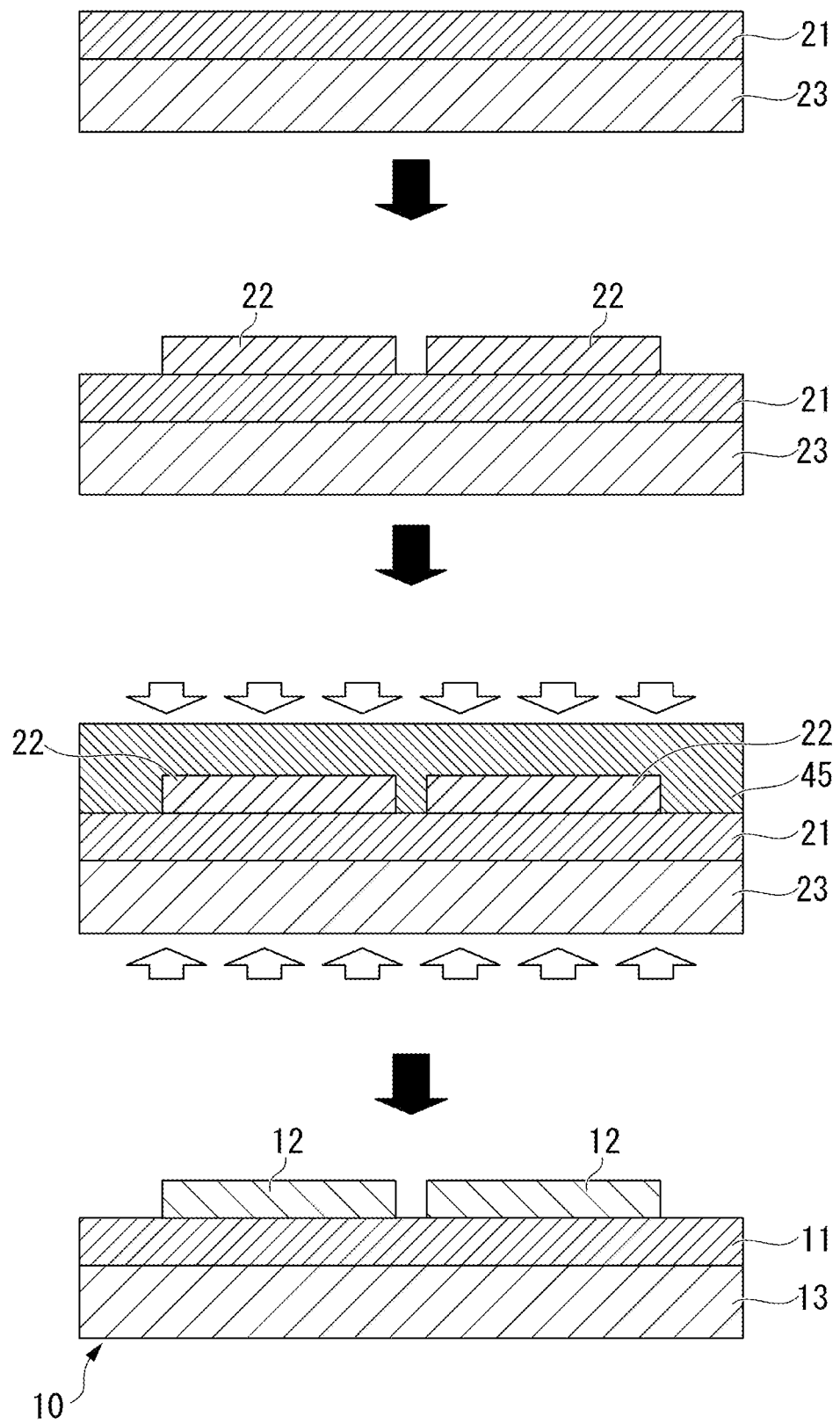
FIG. 6 is an explanatory view showing an example of a method for manufacturing an insulating circuit board according to an embodiment of the present invention.

As shown in FIG. 6, the circuit layer 12 is formed by bonding the metal piece 22 made of a metal having excellent electrical conductivity to one surface (upper surface in FIG. 6) of the insulating resin layer 11. As the metal piece 22, the metal piece formed by punching a metal plate can be used. In the present embodiment, as the metal piece 22 constituting the circuit layer 12, the metal piece that a rolled plate of an oxygen-free copper is punched are used.

In the circuit layer 12, a circuit pattern is formed by disposing the metal piece 22 in the circuit pattern, and one surface (upper surface in FIG. 1) of the circuit pattern is a mounting surface on which the semiconductor element 3 is mounted.

Here, the thickness t of the circuit layer 12 (metal piece 22) is 0.5 mm or more. The thickness t of the circuit layer 12 (metal piece 22) is preferably 1.0 mm or more, and more preferably 1.5 mm or more. In addition, the upper limit of the thickness t of the circuit layer 12 (metal piece 22) is not particularly limited, but in reality, it is 3.0 mm or less.

The closest distance L between the metal pieces 22 provided in the circuit pattern is preferably set such that the ratio L/t to the thickness t of the metal piece 22 provided in the circuit pattern is 2.0 or less. The L/t is more preferably 1.0 or less, and more preferably 0.5 or less.

Specifically, in the present embodiment, the closest distance L between the metal pieces 22 provided in the circuit pattern is set within a range of 1.0 mm or more and 1.5 mm or less.

Figure 3:
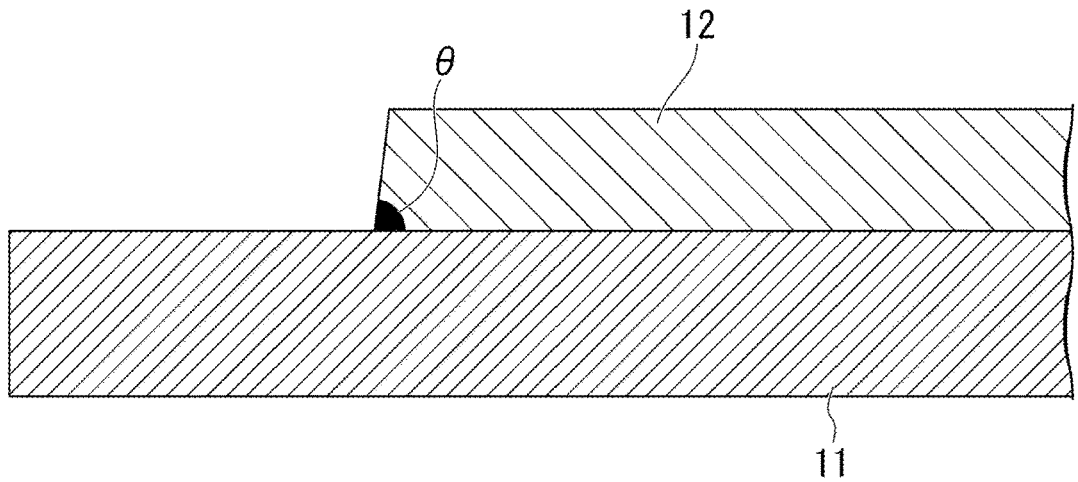
FIG. 3 is an enlarged explanatory view of a bonding interface between a circuit layer (metal piece) and an insulating resin layer in the insulating circuit board shown in FIG. 2.

As shown in FIG. 3, a shape of an end surface of the circuit layer 12 (metal piece 22) in the vicinity of the bonding interface with the insulating resin layer 11 in a cross section along the laminating direction is preferable that an angle θ between a surface of the insulating resin layer 11 and an end surface of the circuit layer 12 (metal piece 22) at the end portion having a circuit pattern is within the range of 700 or more and 1100 or less.

The lower limit of the angle θ is more preferably 800 or more, and more preferably 850 or more. On the other hand, the upper limit of the angle θ is more preferably 1000 or less, and more preferably 950 or less.

The thermal dissipation layer 13 has an effect of improving the thermal dissipation characteristics by spreading heat generated in the semiconductor element 3 mounted on the insulating circuit board 10 in the surface direction. Therefore, the thermal dissipation layer 13 is made of a metal having excellent thermal conductivity, for example, a copper or a copper alloy, an aluminum or an aluminum alloy. In the present embodiment, it is made of the rolled plate of the oxygen-free copper. In addition, the thickness of the thermal dissipation layer 13 is set within the range of 0.05 mm or more and 3 mm or less.

The heat sink 31 is for dissipating heat on the insulating circuit board 10 side. The heat sink 31 is made of copper or a copper alloy, aluminum, an aluminum alloy, or the like having good thermal conductivity. In the present embodiment, a thermal dissipation plate is made of the oxygen-free copper. The thickness of the heat sink 31 is set within the range of 3 mm or more and 10 mm or less.

Here, the thermal dissipation layer 13 of the insulating circuit board 10 and the heat sink 31 are bonded via the solder layer 32.

Figure 4:
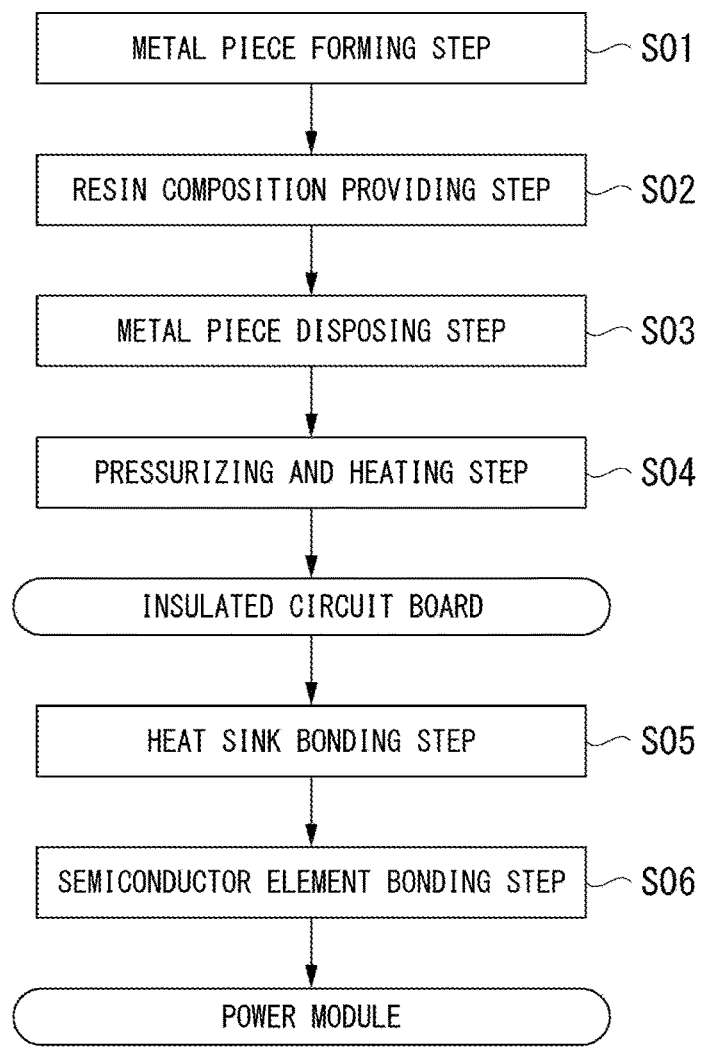
FIG. 4 is a flowchart showing an example of a method for manufacturing an insulating circuit board according to an embodiment of the present invention.
Figure 5:
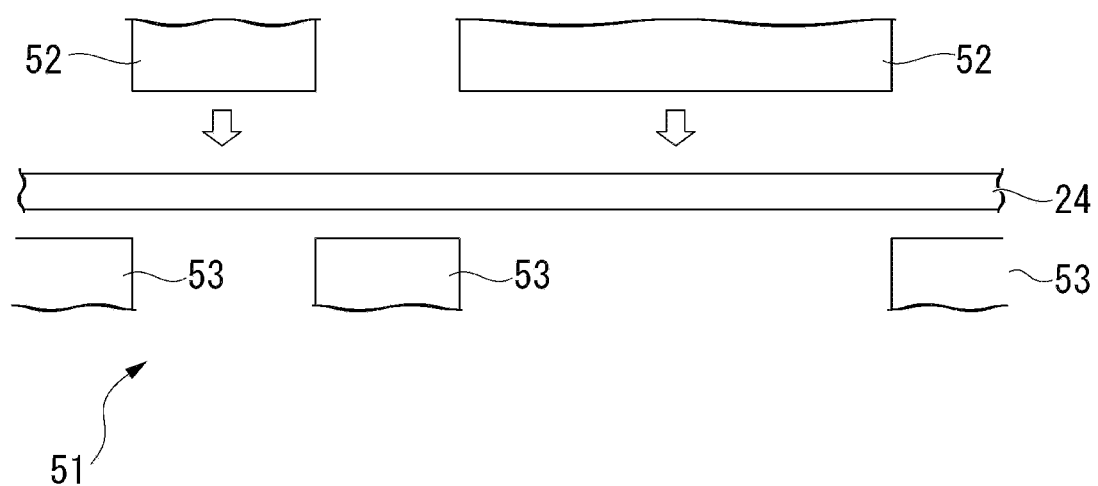
FIG. 5 is an explanatory view showing a metal piece forming step in FIG. 4.

Hereinafter, a method for manufacturing the insulating circuit board according to the present embodiment will be described with reference to FIGS. 4 to 6.

(Metal Piece Forming Step S01)

First, the metal piece 22 serving as the circuit layer 12 is formed. The metal plate 24 (the rolled plate of the oxygen-free copper in the present embodiment) is punched to form the metal piece 22. In the present embodiment, as shown in FIG. 5, the metal plate 24 is sandwiched and sheared by a convex type 52 and a concave type 53 of a punching machine 51. As a result, the metal piece 22 is punched out from the metal plate 24.

(Resin Composition Arranging Step S02)

Next, as shown in FIG. 6, a resin composition 21 containing an alumina as a filler, an epoxy resin as a thermosetting resin, and a curing agent is disposed on one surface (upper surface in FIG. 6) of the metal plate 23 serving as the thermal dissipation layer 13.

(Metal Piece Disposing Step S03)

Next, a plurality of metal pieces 22 are disposed in a circuit pattern on one surface (upper surface in FIG. 6) of the resin composition 21.

(Pressurizing and Heating step S04)

Next, the metal plate 23 serving as the thermal dissipation layer 13, the resin composition 21, and the metal piece 22 are pressurized and heated in the laminating direction, thereby curing the resin composition 21 to form the insulating resin layer 11. At the same time, the thermal dissipation layer 13 and the circuit layer 12 are formed by bonding the metal plate 23 and the insulating resin layer 11, and the insulating resin layer 11 and the metal piece 22.

Here, the present embodiment has a configuration that the pressurizing and heating step S04, the rubber-like elastic body 45 is disposed on the metal piece 22 side, and the metal piece 22 is pressed against the resin composition 21 side. The rubber-like elastic body 45 is made of, for example, a silicon rubber, or the like.

In addition, in the pressurizing and heating step S04, a heating temperature is set within a range of 120° C. or more and 350° C. or less, and a holding time at the heating temperature is within a range of 10 minutes or more and 180 minutes or less. Further, a pressurizing load in the laminating direction is within the range of 1 MPa or more and 30 MPa or less.

Here, the lower limit of the heating temperature is preferably 150° C. or higher, and more preferably 170° C. or higher. On the other hand, the upper limit of the heating temperature is preferably 250° C. or lower, and more preferably 200° C. or lower.

The lower limit of the holding time at the heating temperature is preferably 30 minutes or more, and more preferably 60 minutes or more. On the other hand, the upper limit of the holding time at the heating temperature is preferably 120 minutes or less, and more preferably 90 minutes or less.

The lower limit of the pressurizing load in the laminating direction is preferably 5 MPa or more, and more preferably 8 MPa or more. On the other hand, the upper limit of the pressurizing load in the laminating direction is preferably 15 MPa or less, and more preferably 10 MPa or less.

The insulating circuit board 10 according to the present embodiment is manufactured by each of the steps described above.

(Heat Sink Bonding Step S05)

Next, the heat sink 31 is bonded to the other surface of the thermal dissipation layer 13 of the insulating circuit board 10. In the present embodiment, the thermal dissipation layer 13 and the heat sink 31 are bonded via the solder material.

(Semiconductor Element Bonding Step S06)

Then, the semiconductor element 3 is bonded to the circuit layer 12 of the insulating circuit board 10. In the present embodiment, the circuit layer 12 and the semiconductor element 3 are bonded via the solder material.

By the above steps, the power module 1 shown in FIG. 1 is manufactured.

According to the insulating circuit board 10 of the present embodiment having the above-described configuration, the circuit layer 12 is made of a metal (oxygen-free copper) excellent in the electrical conductivity and the thermal conductivity, and the thickness t of the metal piece 22 constituting the circuit layer 12 is 0.5 mm or more, so that the circuit layer is excellent in the electrical conductivity and thermal dissipation characteristics, and can be favorably applied to an application to load a large current and high voltage.

Further, since the metal piece 22 is provided in the circuit pattern, the shape of the end portion of the circuit layer 12 (metal piece 22) is formed with high accuracy, and the electric field concentration at the end portion of the bonding interface of the circuit layer 12 (metal piece 22) can be suppressed, and the withstand voltage can be improved.

Then, since the insulating resin layer 11 is made of the thermosetting resin and the void ratio B1 of the region A1 (the region where the metal piece 22 is not disposed) positioned between the metal pieces 22 provided in the circuit pattern is 0.8% or less, the insulating resin layer 11 is formed by sufficiently pressurizing, so that the insulating properties in the insulating resin layer 11 can be obtained.

In addition, in the present embodiment, a ratio B2/B1 of the void ratio B2 of the region A2 where the metal piece 22 is disposed and the void ratio B1 of the region A1 positioned between the metal pieces 22 provided in the circuit pattern is within a range of 0.5 or more and 1.5 or less, a difference between the void ratio B1 of the region A1 positioned between the metal pieces 22 provided in the circuit pattern and the void ratio B2 of the region A2 where the metal piece 22 is disposed is small, and the void ratio is relatively uniform in the entire insulating resin layer 11. Therefore, the insulating resin layer 11 is formed by uniformly pressurizing the entire insulating resin layer 11, so that the insulating properties in the insulating resin layer 11 can be sufficiently obtained.

Further, in the present embodiment, since the angle θ between the end portion of the circuit layer 12 (metal piece 22) and the surface of the insulating resin layer 11 is within the range of 700 or more and 1100 or less, the electric field concentration at the end portion of the circuit pattern can be suppressed. Accordingly, the withstand voltage can be further improved.

In addition, in the present embodiment, since the ratio L/t of the thickness t of the metal piece 22 provided in the circuit pattern to the closest distance L between the metal pieces 22 is 1.0 or less, it is possible to reduce the size and weight of components using the insulating circuit board 10.

Further, in the present embodiment, since the thermal dissipation layer 13 is formed on the surface of the insulating resin layer 11 opposite to the circuit layer 12, the thermal dissipation layer 13 can efficiently dissipate heat from the semiconductor element 3 mounted on the circuit layer 12.

Since the method for manufacturing the insulating circuit board according to the present embodiment has the resin composition arranging step S02, the metal piece disposing step S03, and the pressurizing and heating step S04, the formation of the insulating resin layer 11 and the bonding of the metal piece 22, the insulating resin layer 11, and the metal plate 23 can be performed simultaneously, so that the insulating circuit board 10 can be manufactured efficiently.

In addition, the circuit pattern can be formed without performing the etching, the shape of the end portion of the circuit layer 12 can be formed with high accuracy, and the electric field concentration at the end portion of the bonding interface of the circuit layer 12 can be suppressed.

In the present embodiment, since the pressurizing and heating step S04 has a configuration that the rubber-like elastic body 45 is disposed on the metal piece 22 side and is pressurized, the entire resin composition 21 can be sufficiently pressed, and voids in the insulating resin layer 11 can be sufficiently reduced. Thereby, the insulating properties of the insulating resin layer 11 can be secured.

The embodiments of the present invention have been described as above, but the present invention is not limited this, and can be appropriately changed without departing from the technical ideas of the present invention.

For example, the present embodiment has been described in which a power semiconductor element is mounted on the circuit layer of the insulating circuit board to constitute a power module, but the present invention is not limited to this. For example, an LED element may be mounted on an insulating circuit board to form an LED module, or a thermoelectric element may be mounted on a circuit layer of an insulating circuit board to form a thermoelectric module.

In addition, the present embodiment has been described in which the insulating circuit board (the metal board) and the heat sink are bonded via the solder layer, but the present invention is not limited to this, and the insulating circuit board (the metal board) and the heat sink may be laminated via grease.

Further, the material and structure of the heat sink are not limited to the present embodiment, and the design may be changed as appropriate.

The present embodiment has been described as having the metal piece forming step S01 of forming the metal piece 22 by punching the metal plate 24, the present invention is not limited to this, and metal pieces formed by other means may be used.

EXAMPLES

Hereinafter, results of confirmation experiments performed to confirm the effects of the present invention will be described.

The rolled plate of the oxygen-free copper (50 mm×60 mm×thickness 2.0 mm) is prepared as a metal plate serving as the thermal dissipation layer, and a sheet material of the resin composition shown in Table 1 is disposed on one surface of the metal plate.

In Examples 1 to 10 of the present invention and Comparative Examples 4 and 5, the metal piece (20 mm×20 mm) shown in Table 1 are disposed in a pattern on one surface of the resin composition. At this time, the metal pieces are disposed such that the closest distance between the metal pieces is a value shown in Table 1. A guide jig having an open hole corresponding to the circuit shape to be formed is used, and a metal circuit piece is fitted into the hole of the guide jig so as to be disposed with high accuracy.

In Comparative Examples 1 to 3 and 6, the metal plate (50 mm×60 mm) shown in Table 1 is disposed on one surface of the resin composition.

Then, as the pressurizing and heating step, the metal plate, the resin composition, and the metal piece are pressurized and heated in the laminating direction under the conditions shown in Table 2 to cure the resin composition, thereby forming the insulating resin layer, and bonding the metal plate, the insulating resin layer, and the metal piece (metal plate).

At this time, in Examples 1 to 10 of the present invention and Comparative Example 5, a rubber-like elastic body (thickness: 4.0 mm) made of the silicon rubber is disposed on the metal piece side and pressurized in the laminating direction. In addition, in Comparative Example 4, pressure is applied without using the rubber-like elastic body.

Further, in Comparative Examples 1 to 3 and 6, the metal plate serving as the circuit layer is etched to form a circuit pattern such that the closest distance is the value shown in Table 1.

By using a KEYENCE image dimension measuring device, a distance between individual pieces is read from a captured image and the closest distance is measured.

With respect to the insulating circuit board obtained as described above, the angle θ between the end portion of the circuit layer (metal piece) and the surface of the insulating resin layer, the void ratio in the region between the metal pieces which are provided in the circuit pattern, a thermal dissipation property evaluation (thermal resistance), and an insulating properties evaluation (insulating breakdown voltage) are evaluated as follows.

(Angle θ Between End Portion of Circuit Layer (Metal Piece) and Surface of Insulating Resin Layer)

After the cross section polisher (SM-09010 manufactured by JEOL Ltd.) is used to perform ion etching on the cross section of the circuit layer at an ion acceleration voltage of 5 kV, a processing time of 14 hours, and a protruding amount from a shielding plate of 100 μm, the end portion of the circuit pattern is observed using a scanning electron microscope (SEM). Then, the angle θ between the end portion of the circuit layer (metal piece) and the surface of the insulating resin layer is measured. The evaluation results are shown in Table 2.

(Void Ratio of Region Between Metal Pieces Provided in Circuit Pattern)

A cross section photograph (visual field size: 150 μm×100 μm, number of visual fields: 30 visual fields for each sample) obtained by performing cross section observation with a laser microscope is subjected to image processing using image analysis software "Image J" to calculate the void ratio. The evaluation results are shown in Table 2.

(Thermal Resistance)

The thermal resistance of the insulating circuit board is measured by a thermal transient measurement method based on JESD51. The evaluation results are shown in Table 2.

(Insulating Breakdown Voltage)

Figure 7:
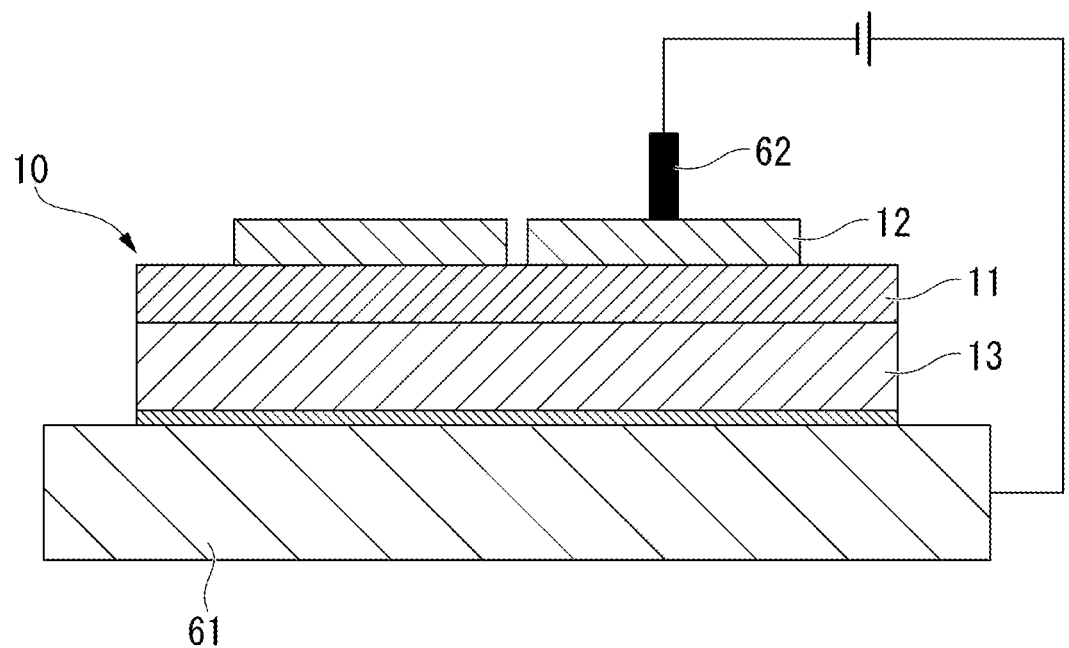
FIG. 7 is a schematic explanatory view of a test device for evaluating a withstand voltage of an insulating circuit board in an example.

As shown in FIG. 7, the thermal dissipation layer is placed on a base plate 61, a probe 62 is brought into contact with the circuit layer, and a partial discharge is evaluated. A partial discharge tester manufactured by Mitsubishi Electric Wire Co., Ltd. is used as a measuring device. As a test atmosphere, it is performed in Fluorinert™ FC-770 manufactured by 3M.

Then, the voltage is boosted by a step profile (holding time of 60 seconds) at each 0.5 kV, and a voltage at which an insulating breakdown occurs (a voltage at which a leakage current is 10 mA or more) is set as the insulating breakdown voltage. The evaluation results are shown in Table 2.

TABLE 1

| | Resin composition (insulating resin layer) | | | | Circuit layer (metal piece) | | |
| --- | --- | --- | --- | --- | --- | --- | --- |
| | Thermosetting resin | Inorganic filler | Thickness mm | Thermal conductivity W/(m · K) | Material | Thickness mm | Closest distance mm |
| Example 1 | Epoxy | Al$_2$O$_3$, BN | 150 | 15 | OFC | 0.5 | 1.0 |
| Example 2 | Epoxy | Al$_2$O$_3$, BN | 150 | 15 | OFC | 1.0 | 1.0 |
| Example 3 | Epoxy | Al$_2$O$_3$, BN | 150 | 15 | OFC | 1.5 | 1.0 |
| Example 4 | Epoxy | Al$_2$O$_3$, BN | 150 | 15 | OFC | 1.5 | 1.0 |
| Example 5 | Epoxy | Al$_2$O$_3$, BN | 150 | 15 | OFC | 1.5 | 1.0 |
| Example 6 | Epoxy | Al$_2$O$_3$, BN | 150 | 15 | OFC | 1.5 | 1.0 |
| Example 7 | Epoxy | Al$_2$O$_3$, BN | 150 | 15 | OFC | 1.5 | 1.0 |
| Example 8 | Epoxy | Al$_2$O$_3$, BN | 200 | 10 | OFC | 1.5 | 1.0 |
| Example 9 | Epoxy | Al$_2$O$_3$ | 120 | 5 | OFC | 1.5 | 1.0 |
| Example 10 | Polyimide | BN | 60 | 0.8 | OFC | 1.5 | 1.0 |
| Comparative Example 1 | Epoxy | Al$_2$O$_3$, BN | 150 | 15 | OFC | 0.3 | 1.0 |
| Comparative Example 2 | Epoxy | Al$_2$O$_3$, BN | 150 | 15 | OFC | 0.5 | 1.0 |
| Comparative Example 3 | Epoxy | Al$_2$O$_3$, BN | 150 | 15 | OFC | 0.5 | 1.0 |
| Comparative Example 4 | Epoxy | Al$_2$O$_3$, BN | 150 | 15 | OFC | 0.5 | 1.0 |

TABLE 1-continued

| | Resin composition (insulating resin layer) | | | | Circuit layer (metal piece) | | |
|---|---|---|---|---|---|---|---|
| | Thermosetting resin | Inorganic filler | Thickness mm | Thermal conductivity W/(m · K) | Material | Thickness mm | Closest distance mm |
| Comparative Example 5 | Epoxy | $Al_2O_3$, BN | 150 | 15 | OFC | 0.3 | 1.0 |
| Comparative Example 6 | Polyimide | BN | 50 | 0.8 | OFC | 0.3 | 1.0 |

TABLE 2

| | Resin composition (insulating resin layer) | | | Circuit layer (metal piece) | | | |
|---|---|---|---|---|---|---|---|
| | Temperature °C. | Time min | Pressure MPa | Angle θ[X-1] ° | Void ratio[X-2] % | Thermal resistance | Insulating breakdown voltage kV/mm |
| Example 1 | 180 | 60 | 10 | 90 | 0.5 | 49.0 | 56.7 |
| Example 2 | 180 | 60 | 10 | 91 | 0.5 | 44.0 | 56.7 |
| Example 3 | 180 | 60 | 10 | 90 | 0.6 | 40.0 | 56.7 |
| Example 4 | 180 | 60 | 10 | 78 | 0.7 | 40.2 | 54.3 |
| Example 5 | 180 | 60 | 10 | 72 | 0.5 | 40.5 | 57.7 |
| Example 6 | 180 | 60 | 10 | 97 | 0.6 | 40.8 | 58.6 |
| Example 7 | 180 | 60 | 10 | 108 | 0.6 | 40.3 | 56.9 |
| Example 8 | 180 | 60 | 10 | 88 | 0.4 | 51.0 | 65.0 |
| Example 9 | 180 | 60 | 5 | 90 | 0.5 | 52.0 | 50.0 |
| Example 10 | 300 | 60 | 5 | 88 | 0.2 | 55.0 | 66.7 |
| Comparative Example 1 | 180 | 60 | 10 | 45 | 0.5 | 61.0 | 46.7 |
| Comparative Example 2 | 180 | 60 | 10 | 48 | 0.5 | 49.0 | 46.7 |
| Comparative Example 3 | 180 | 60 | 10 | 40 | 0.4 | 49.0 | 46.7 |
| Comparative Example 4 | 180 | 60 | 10 | 91 | 4.8 | 52.0 | 26.7 |
| Comparative Example 5 | 180 | 60 | 10 | 87 | 0.4 | 61.0 | 56.7 |
| Comparative Example 6 | 300 | 60 | 5 | 45 | 0.3 | 66.0 | 48.6 |

[X-1]Angle θ: angle between an end portion of circuit layer (metal piece) and a surface of insulating resin layer
[X-2]Void ratio: void ratio of a region between metal pieces provided in a circuit pattern In Comparative Example 1 in which the circuit layer having a circuit pattern is formed by the etching and the thickness of the circuit layer is 0.3 mm, the angle θ between the end portion of the circuit layer and the surface of the insulating resin layer is an acute angle of 45°, and the insulating breakdown voltage is as low as 46.7 kV/mm. It is presumed that this is because the electric field concentration has occurred in the end portion of the circuit layer. In addition, since the circuit layer is thin, the thermal resistance is high and the thermal dissipation characteristics are insufficient.

In Comparative Examples 2 and 3 in which the circuit layer having a circuit pattern is formed by the etching, each of the angle θ between the end portion of the circuit layer and the surface of the insulating resin layer is an acute angle of 48° and 40°, and the insulating breakdown voltage is as low as 46.7 kV/mm. It is presumed that this is because the electric field concentration has occurred in the end portion of the circuit layer.

In Comparative Example 4 in which the rubber-like elastic body is not used for pressurizing and heating the metal piece disposed in a circuit pattern, the void ratio of the region between the metal pieces is as high as 4.8%, and the insulating breakdown voltage is as low as 26.7 kV/mm. It is presumed that this is because the resin composition cannot be sufficiently pressurized.

In Comparative Example 5 in which the thickness of the circuit layer (metal piece) is 0.3 mm, the thermal resistance is high. It is presumed that this is because the heat cannot be sufficiently spread in the circuit layer.

In Comparative Example 6 in which the circuit layer having a circuit pattern is formed by the etching and the thickness of the circuit layer is 0.3 mm and a polyimide resin is used as the thermosetting resin, the angle θ between the end portion of the circuit layer and the surface of the insulating resin layer is an acute angle of 45°, and the insulating breakdown voltage is as low as 48.6 kV/mm. It is presumed that this is because the electric field concentration has occurred in the end portion of the circuit layer. In addition, since the circuit layer is thin, the thermal resistance is high and the thermal dissipation characteristics are insufficient.

On the other hand, in Examples 1 to 9 of the present invention, which satisfies the provisions of the present invention and uses the epoxy resin as the thermosetting resin, the thermal resistance is sufficiently low and the thermal dissipation properties are excellent. In addition, the insulating breakdown voltage is 50.0 kV/mm or more, and the insulating properties are excellent.

Further, in Example 10 of the present invention, which satisfies the provisions of the present invention and uses the polyimide resin as the thermosetting resin, in comparison with Comparative Example 6 using the polyimide resin as the thermosetting resin, the thermal resistance is sufficiently low, the insulating breakdown voltage is high, and the thermal dissipation properties and the insulating properties are excellent.

From the above, according to examples of the present invention, it has been confirmed that it is possible to provide an insulating circuit board having a relatively thick circuit layer, a shape of an end portion of the circuit layer, which is formed with high accuracy, and an excellent withstand voltage, and a method for manufacturing the insulating circuit board.

INDUSTRIAL APPLICABILITY

According to the present invention, it is possible to provide an insulating circuit board having a relatively thick circuit layer, a shape of an end portion of the circuit layer, which is formed with high accuracy, and an excellent withstand voltage.

REFERENCE SIGNS LIST

1: power module
3: semiconductor element
10: insulating circuit board
11: insulating resin layer
12: circuit layer
13: thermal dissipation layer
21: resin composition
22: metal piece
23: metal plate
45: rubber-like elastic body

What is claimed is:

1. An insulating circuit board comprising:
an insulating resin layer; and
a circuit layer made of metal pieces, each of which is in a circuit pattern and provided on one surface of the insulating resin layer, wherein
thickness t of each of the metal pieces constituting the circuit layer is 0.5 mm or more,
a closest distance L between the metal pieces provided in the circuit pattern is within a range of 1.0 mm or more and 1.5 mm or less,
a ratio L/t is 1.0 or less,
the insulating resin layer is made of a thermosetting resin, a void ratio B1 of a region between the metal pieces is 0.8% or less, and a ratio B2/B1 of a void ratio B2 of a region where the metal piece is disposed to the void ratio B1 of the region between the metal pieces is within a range of 0.5 or more and 1.5 or less, and
an angle θ between an end portion of each of the metal pieces and a surface of the insulating resin layer is within a range of 70° or more and 110° or less.

2. The insulating circuit board according to claim 1, wherein
a thermal dissipation layer is formed on a surface of the insulating resin layer opposite to the circuit layer.

3. A method for manufacturing the insulating circuit board according to claim 1, the method comprising:
a metal piece forming step of forming the metal piece to be the circuit layer;
a resin composition providing step of providing a resin composition to be a thermal dissipation layer on one surface of a metal plate;
a metal piece disposing step of disposing a plurality of the metal pieces in a circuit pattern on one surface of the resin composition; and
a pressurizing and heating step of pressurizing and heating the metal plate, the resin composition, and the metal pieces in a laminating direction, wherein
in the pressurizing and heating step, a rubber-like elastic body is disposed on the metal piece side, and the metal pieces are pressed against the resin composition side, and the thermal dissipation layer and the circuit layer are formed by forming an insulation layer by curing the resin composition, by bonding the metal plate and the insulating layer and by bonding the insulating layer and the metal pieces.

* * * * *